United States Patent
Hashimoto

(10) Patent No.: US 8,073,029 B2
(45) Date of Patent: Dec. 6, 2011

(54) SEMICONDUCTOR OPTICAL DEVICE

(75) Inventor: Jun-ichi Hashimoto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 6 days.

(21) Appl. No.: 12/320,438

(22) Filed: Jan. 26, 2009

(65) Prior Publication Data

US 2009/0219967 A1 Sep. 3, 2009

(30) Foreign Application Priority Data

Jan. 30, 2008 (JP) ................. P2008-019686

(51) Int. Cl.
*H01S 3/00* (2006.01)
*H01S 3/04* (2006.01)
*H01S 5/00* (2006.01)

(52) U.S. Cl. ................. 372/38.01; 372/43.01; 372/50.1; 372/50.11

(58) Field of Classification Search ............... 372/38.01, 372/43.01, 50.1, 50.11
See application file for complete search history.

(56) References Cited

U.S. PATENT DOCUMENTS

| | | | |
|---|---|---|---|
| 6,738,405 B1 * | 5/2004 | Yamaguchi et al. | 372/50.1 |
| 2005/0201439 A1 * | 9/2005 | Horie | 372/43.01 |
| 2007/0053397 A1 * | 3/2007 | Burckel et al. | 372/43.01 |
| 2007/0291805 A1 * | 12/2007 | Ledentsov et al. | 372/38.01 |

FOREIGN PATENT DOCUMENTS

| | | |
|---|---|---|
| JP | 2001-144371 | 5/2001 |
| WO | 2004-027950 | 4/2004 |

OTHER PUBLICATIONS

IEEE Journal Quantum Electron., "Longitudinal-Mode Characteristic of Weekly . . . Phenomena", Hideyoshi Horie et al., vol. 36, No. 12, (Dec. 2000), pp. 1454-1461.

* cited by examiner

*Primary Examiner* — Patrick Stafford
(74) *Attorney, Agent, or Firm* — Smith, Gambrell & Russell, LLP

(57) ABSTRACT

To provide a semiconductor optical device which can restrain laser characteristics from being deteriorated by excitation in a substrate mode and can reduce the number of manufacturing steps. A semiconductor optical device comprises a first DBR layer, provided on a semiconductor substrate, having first and second semiconductor layers stacked alternately, a first cladding layer, an active layer, and a second cladding layer. The semiconductor substrate has a bandgap higher than that of the active layer. The first DBR layer is transparent to light having an emission wavelength, while the first and second semiconductor layers have respective refractive indices different from each other. Since the first DBR layer is thus provided between the semiconductor substrate and first cladding layer, the guided light reaching the lower end of the first cladding layer, if any, is reflected by the first DBR layer, whereby light can be restrained from leaking to the semiconductor substrate. This can avoid the substrate-mode excitation, thereby suppressing its resulting laser characteristic deteriorations such as destabilization of oscillation wavelengths.

9 Claims, 8 Drawing Sheets

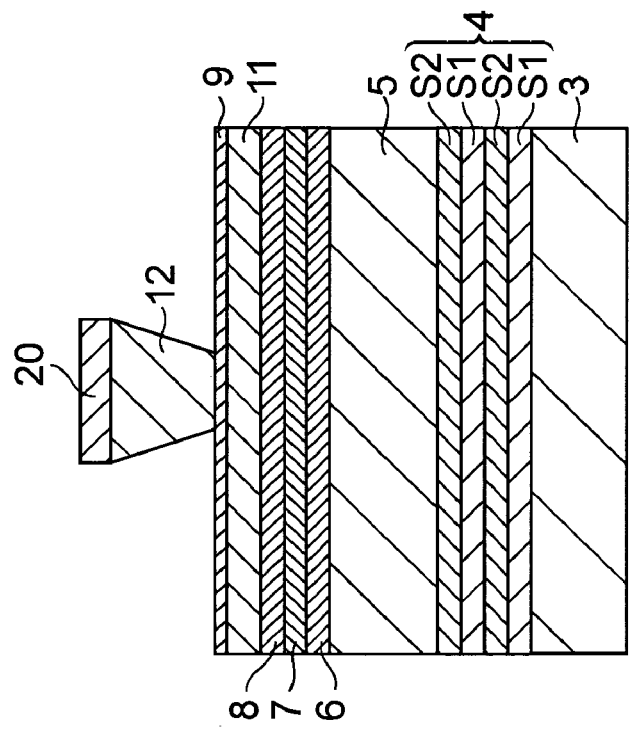
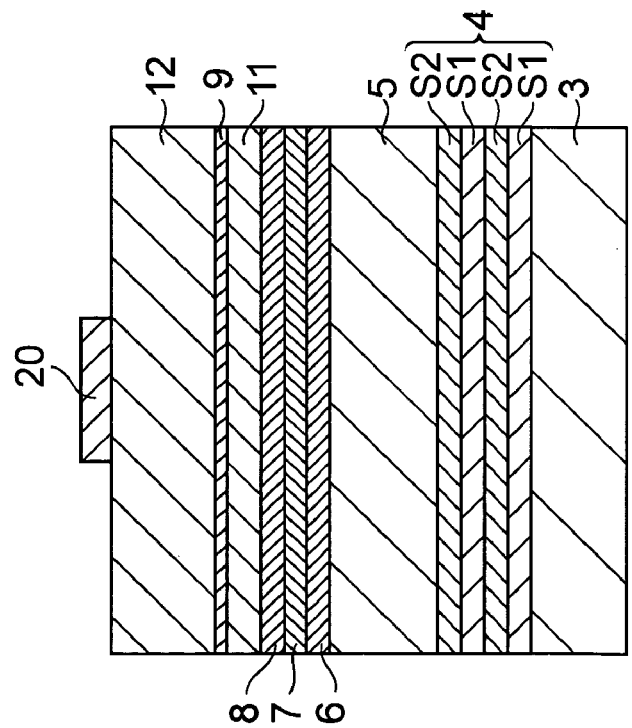
Fig.3A
Fig.3B

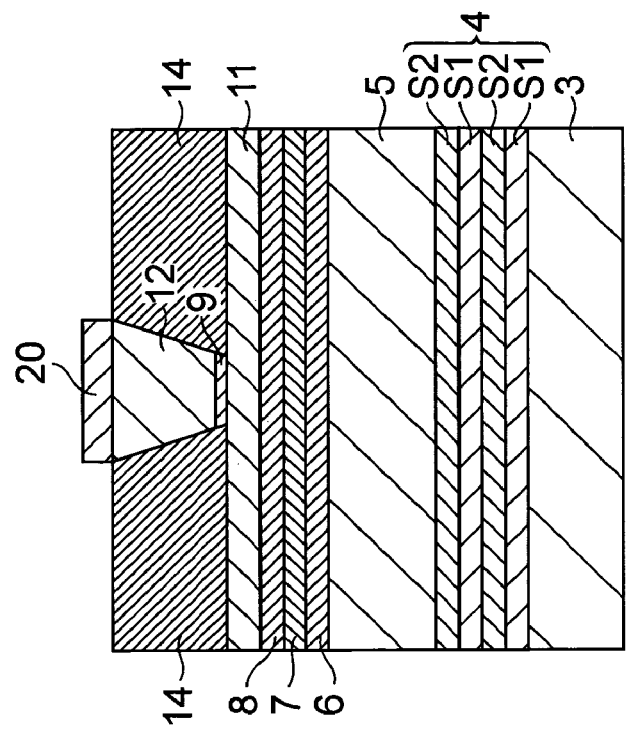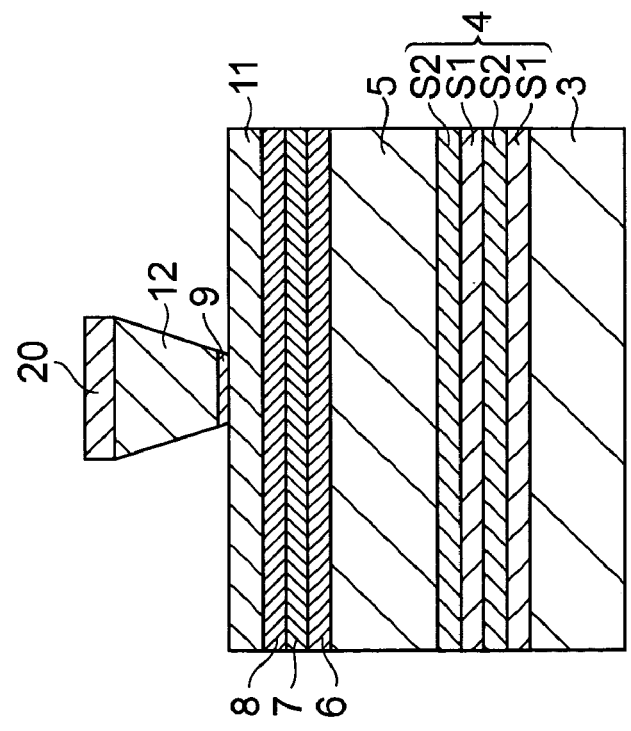

SEMICONDUCTOR OPTICAL DEVICE

BACKGROUND OF THE INVENTION

1. Field of the Invention

The present invention relates to a semiconductor optical device.

2. Related Background Art

Semiconductor lasers have been known as one of semiconductor optical devices. For example, as semiconductor lasers having emission wavelengths in a wavelength band of at least 0.9 μm but not more than 1.25 μm, those equipped with a semiconductor layer of GaInAs, GaInAsP, or the like on a GaAs substrate have been known. In particular, semiconductor lasers having an oscillation wavelength in a 0.98-μm band have been in use as pumping light sources for erbium-doped optical fiber amplifier s (hereinafter abbreviated as "EDFA") which are optical amplifiers in a 1.55-μm wavelength band. Semiconductor lasers having emission wavelengths in a 1.017-μm band have been in use as pumping light sources for praseodymium-doped optical fiber amplifiers (hereinafter abbreviated as "PDFA") which are optical amplifiers in a 1.3-μm wavelength band.

A semiconductor laser fabricated on a GaAs substrate is described in IEEE J. Quantum Electron., vol. 36, no. 12, (2000), pp. 1454-1461, and International Publication No. 2004/027950 pamphlet. This semiconductor laser has specific wavelength characteristics, especially wavelength fluctuations, due to a resonance coupling between a waveguide mode and a GaAs substrate mode. To reduce the resonance coupling between the waveguide mode and the GaAs substrate mode, a semiconductor laser having a light absorbing layer between the GaAs substrate and the lower electrode is disclosed in Japanese Patent Application No. 2001-144371.

SUMMARY OF THE INVENTION

FIG. 8 shows typical examples of oscillation spectra of a conventional FP (Fabry-Perot) type semiconductor laser having an emission wavelength in the 0.98-μm band. In FIG. 8, G1, G2, G3, G4, G5, and G6 represent respective oscillation spectra at currents of 50 mA, 100 mA, 150 mA, 200 mA, 250 mA, and 300 mA. Referring to FIG. 8, the oscillation spectra are found to have an intensity-modulated characteristic in which intensity is periodically maximized at intervals of a wavelength of at least 2 nm but not more than 3 nm. This intensity-modulated characteristics is attributed to the resonance coupling between the waveguide mode and the GaAs substrate mode. The reason why the resonance coupling between the waveguide mode and the GaAs substrate mode occurs will now be described in the following. GaAs substrate are transparent to light in a wavelength band between 0.9 μm and 1.25 μm. And the refractive index of the GaAs substrate is higher than that of GaInP or AlGaAs which is used for a material of cladding layer of the semiconductor laser fabricated on a GaAs substrate. Therefore, the refractive index of the GaAs substrate may be higher than the effective refractive index of a waveguide structure including the GaInP or AlGaAs cladding layer. In this case, the GaAs substrate becomes waveguide for light in the above-mentioned wavelength band, thus generating a GaAs substrate mode. It is explained that the GaAs substrate mode resonantly couples with the waveguide mode. This resonance coupling between the waveguide mode and the GaAs substrate mode causes a periodic intensity modulation of lasing spectra and wavelength fluctuations in the semiconductor laser fabricated on a GaAs substrate.

Meanwhile, a specific wavelength characteristic in which one to several maximal-point longitudinal modes in gain-center areas are oscillated and then shift to adjacent maximal-point wavelengths on the longer wavelength side as the current increases is observed in the oscillation spectra of the semiconductor laser shown in FIG. 8. Such a mode hop in the longitudinal mode is undesirable in that it causes a large fluctuation in oscillation wavelengths. When G1 and G6 shown in FIG. 8 are compared with each other, for example, the oscillation wavelength is found to fluctuate by about 15 nm between the currents of 50 mA and 300 mA. For pumping an EDFA, for example, a wavelength band which can effectively pump the EDFA is at least 975 nm but not more than 985 nm. That is, the wavelength band capable of effectively pumping the EDFA is a narrow band of about 10 nm. Therefore, the wavelength fluctuation due to such a mode hop is not negligible when pumping the EDFA. Also, the mode hop generates mode-hop noise and thus may deteriorate the signal to noise intensity ratio (S/N ratio) of laser emission light. Further, the mode hop and output power fluctuations between oscillation longitudinal modes may change the oscillation condition, thus causing nonlinearity in the light output vs. current characteristic of the semiconductor laser, i.e., so-called kink, whereby linear optical amplification becomes difficult, and so forth.

The semiconductor laser having a light absorbing layer is described in Japanese Patent Application Publication No. 2001-144371. However, this does not prevent the oscillation light from being guided through the GaAs substrate, and thus cannot completely eliminate the substrate mode. Furthermore, for providing such a light absorbing layer, an alloying reaction step for forming the light absorbing layer needs to be performed on the back face of the substrate in addition to the step of forming semiconductor layers on the substrate, which may complicate the manufacturing process, thereby making it difficult to realize high productivity and cost reduction.

It is therefore an object of the present invention to provide a semiconductor optical device which can improve laser characteristics by eliminating its substrate mode while suppressing the number of manufacturing steps.

The semiconductor optical device in accordance with the present invention is a semiconductor optical device of an edge-emitting type having a predetermined emission wavelength, the semiconductor optical device comprising a first DBR (Distributed Bragg Reflector) layer, formed on a semiconductor substrate, having first and second semiconductor layers stacked alternately; a first cladding layer provided on the first DBR layer; an active layer provided on the first cladding layer; and a second cladding layer provided on the active layer; wherein the semiconductor substrate has a bandgap higher than that of the active layer; and wherein the first DBR layer is transparent to the emission wavelength, while the first and second semiconductor layers have respective refractive indices different from each other.

Since the first DBR layer is provided between the semiconductor substrate and first cladding layer in the semiconductor optical device in accordance with the present invention, guided light reaching the lower end of the first cladding layer, if any, is reflected by the first DBR layer, whereby light can be restrained from leaking to the semiconductor substrate. Therefore, substrate-mode excitation is avoided, whereby its resulting deteriorations in laser characteristics such as destabilization of oscillation wavelengths can be suppressed. The number of steps of manufacturing the semiconductor optical device can also be suppressed, since the first DBR layer can be formed on the semiconductor substrate together with other semiconductor layers.

In the present invention, "the first DBR layer is transparent to the emission wavelength" means that each of the first and second semiconductor layers constituting the first DBR layer has a bandgap energy higher than that of the active layer, whereby the light is not absorbed in the first DBR layer, for example.

Preferably, the above-mentioned semiconductor optical device may further comprise a front facet and a back facet, and a laser cavity is comprised of the front facet and the back facet.

Preferably, in the above-mentioned semiconductor optical device, the semiconductor substrate is a GaAs substrate, while the active layer has a bandgap corresponding to an emission wavelength of at least 0.9 µm but not more than 1.25 µm.

When a GaAs substrate is employed with an emission wavelength of at least 0.9 µm but not more than 1.25 µm as in this semiconductor optical device, wavelength fluctuations due to a mode hop such as those mentioned above tend to occur remarkably. Since the first DBR layer is provided between the semiconductor substrate and first cladding layer in the above-mentioned semiconductor optical device, however, the substrate-mode excitation is avoided, whereby its resulting deteriorations in laser characteristics such as destabilization of oscillation wavelengths can effectively be suppressed.

Preferably, in the above-mentioned semiconductor optical device, the first DBR layer has a reflectivity which is greater than or equal to 50%.

Preferably, in the above-mentioned semiconductor optical device, the first semiconductor layer is constituted by AlAs or AlGaAs, while the second semiconductor layer is constituted by GaAs.

When the first semiconductor layer is constituted by AlAs or AlGaAs while the second semiconductor layer is constituted by GaAs as such, a high reflectivity of 99% or more, for example, can be realized as the reflectivity of the first DBR layer with respect to light at the emission wavelength. Since these semiconductor materials are lattice-matched to GaAs, a favorable crystalline quality is kept even when laminated by a number of layers. Since these semiconductor materials are transparent to light having a wavelength of at least 0.9 µm but not more than 1.25 µm, no absorption loss increases upon adding the first DBR layer as long as the emission wavelength falls within this range.

The above-mentioned semiconductor optical device may further comprise a second DBR layer, formed on the second cladding layer, having third and fourth semiconductor layers stacked alternately, and a contact layer formed on the second DBR layer; wherein the second DBR layer is transparent to the emission wavelength, while the third and fourth semiconductor layers have respective refractive indices different from each other.

Since the second DBR layer is provided on the second cladding layer in this semiconductor optical device, guided light reaching the upper end of the second cladding layer, if any, is reflected by the second DBR layer, whereby light can be restrained from leaking to the contact layer. Therefore, the waveguide mode excitation due to the contact layer is avoided, whereby its resulting deteriorations in laser characteristics such as destabilization of oscillation wavelengths can be suppressed.

Preferably, in the above-mentioned semiconductor optical device, the contact layer is constituted by GaAs.

Preferably, in the above-mentioned semiconductor optical device, the third semiconductor layer is constituted by GaAs, while the fourth semiconductor layer is constituted by AlAs or AlGaAs.

Since then the third semiconductor layer is constituted by GaAs while the fourth semiconductor layer is constituted by AlAs or AlGaAs as such, this semiconductor optical device can realize a high reflectivity of 99% or more, for example, as the reflectivity of the second DBR layer with respect to light at the emission wavelength. These semiconductor materials are lattice-matched to GaAs, and thus keep a favorable crystalline quality even when stacked by a number of layers. Since these semiconductor materials are transparent to light having a wavelength of at least 0.9 µm but not more than 1.25 µm, no absorption loss increases upon adding the second DBR layer as long as the emission wavelength falls within this range.

Preferably, in the above-mentioned semiconductor optical device, the second DBR layer has a reflectivity which is greater than or equal to 50%.

Preferably, in the above-mentioned semiconductor optical device, the active layer is constituted by a semiconductor material selected from GaInAs, GaInAsP, and III-V compound semiconductors containing Ga, As, and N.

When such a semiconductor material is used in the active layer, the semiconductor optical device has an emission wavelength of at least 0.9 µm but not more than 1.25 µm. In this case, wavelength fluctuations due to mode hops such as those mentioned above tend to occur remarkably. Since the first DBR layer is provided between the semiconductor substrate and first cladding layer in the above-mentioned semiconductor optical device, however, the substrate-mode excitation is avoided, whereby its resulting deteriorations in laser characteristics such as destabilization of oscillation wavelengths can effectively be suppressed.

Preferably, in the above-mentioned semiconductor optical device, the first cladding layer is constituted by a semiconductor material having a bandgap energy higher than that of the semiconductor substrate.

Preferably, in the above-mentioned semiconductor optical device, the first cladding layer is constituted by GaInP, AlGaInP, AlGaAs, or GaInAsP.

Preferably, in the above-mentioned semiconductor optical device, the second cladding layer is constituted by a semiconductor material having a bandgap energy higher than that of the contact layer.

Preferably, in the above-mentioned semiconductor optical device, the second cladding layer is constituted by GaInP, AlGaInP, AlGaAs, or GaInAsP.

BRIEF DESCRIPTION OF THE DRAWINGS

FIGS. 3A and 3B are process diagrams showing a method of manufacturing the semiconductor optical device in accordance with the first embodiment;

FIGS. 4A and 4B are process diagrams showing the method of manufacturing the semiconductor optical device in accordance with the first embodiment;

DESCRIPTION OF THE PREFERRED EMBODIMENTS

In the following, embodiments of the semiconductor optical device in accordance with the present invention will be explained in detail with reference to the accompanying drawings. In the explanation of the drawings, the same constituents will be referred to with the same numerals or letters while omitting their overlapping descriptions.

First Embodiment

Figure 1:
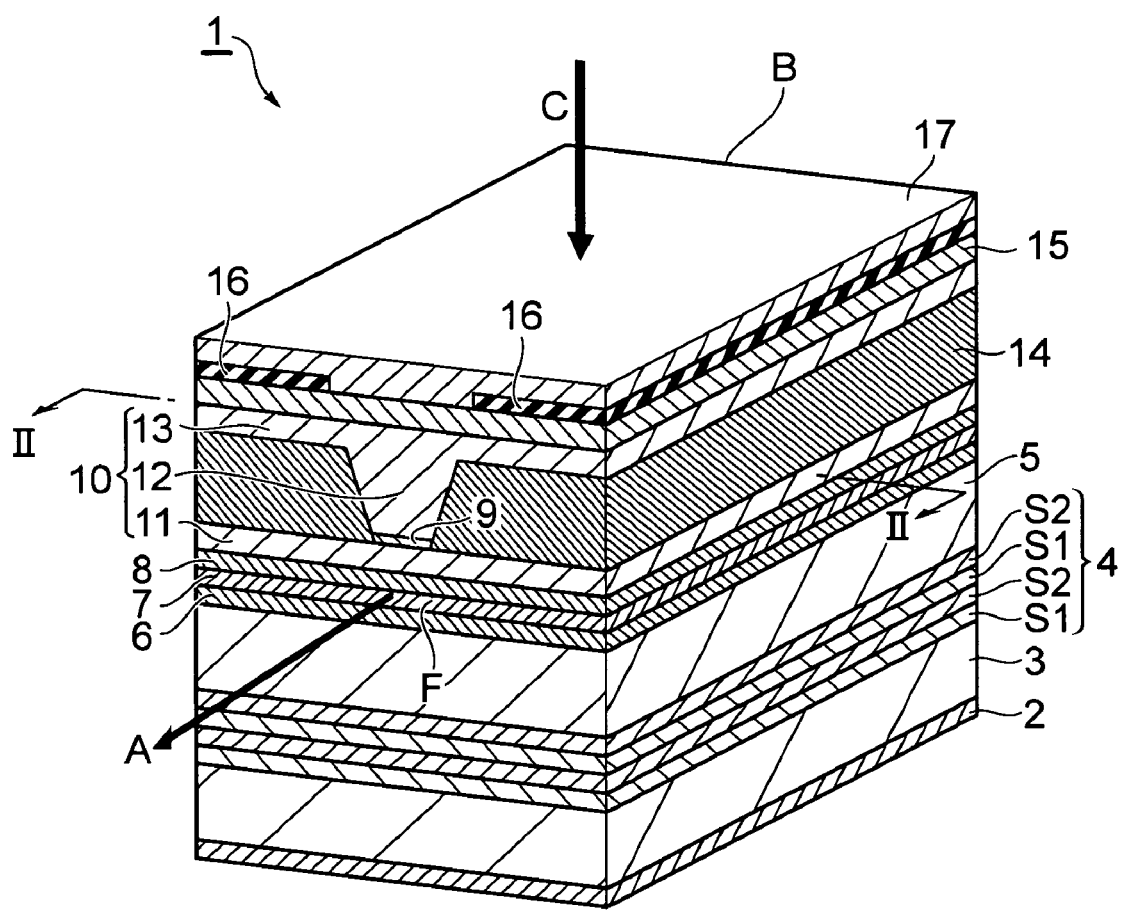
FIG. 1 is a perspective view showing the semiconductor optical device in accordance with the first embodiment.
Figure 2:
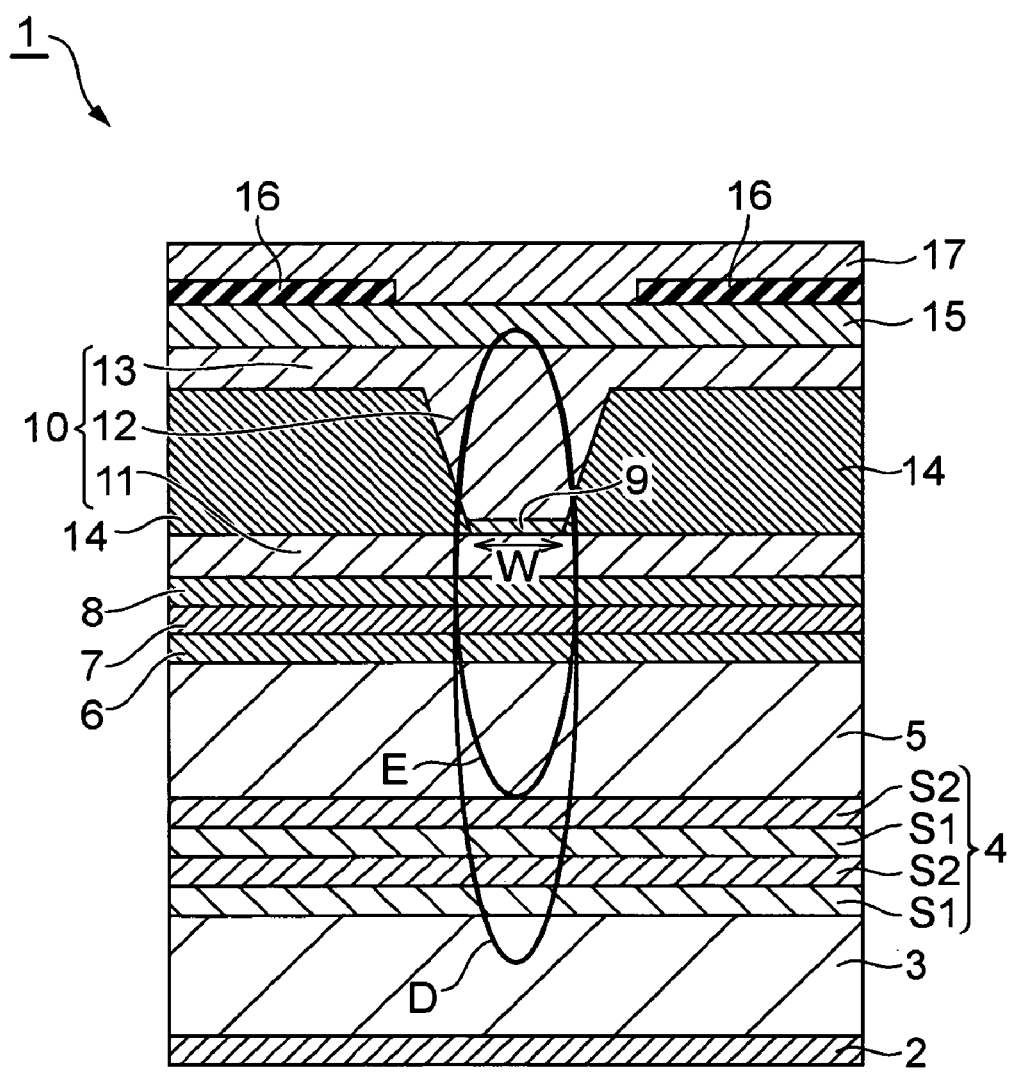
FIG. 2 is a sectional view taken along the line II-II of FIG. 1.

FIG. 1 is a perspective view showing the semiconductor optical device in accordance with the first embodiment. FIG. 2 is a sectional view taken along the line II-II shown in FIG. 1. Referring to FIG. 1, a semiconductor optical device 1 of an edge-emitting type such as a semiconductor laser device is shown. The semiconductor optical device 1 in this embodiment is an "edge-emitting" semiconductor laser which emits laser light in a direction (of arrow A) parallel to a substrate surface, and differs from "surface-emitting" semiconductor lasers which emit light in a direction perpendicular to the substrate surface. The semiconductor optical device 1 has a front facet F and back facet B. A laser light is emitted from the front facet. In the edge-emitting semiconductor optical device 1, both facets of the semiconductor optical device 1 act as reflecting mirrors, while these reflecting mirrors construct a laser cavity. The emission wavelength of laser light emitted from the semiconductor optical device 1, i.e., oscillation wavelength, is determined by the laser cavity and the material constituting the active layer.

The semiconductor optical device 1 comprises an n-type electrode 2, an n-type GaAs substrate 3, an n-type DBR (Distributed Bragg Reflector) layer 4, an n-type lower cladding layer 5, a lower optical confinement layer 6, an active layer 7, an upper optical confinement layer 8, a p-type upper cladding layer 10, a p-type contact layer 15, an insulating film 16, and a p-type electrode 17.

The n-type GaAs substrate 3 is the semiconductor substrate in this embodiment. The n-type GaAs substrate 3 is formed by cleaving a GaAs wafer and thus has a cleavable thickness. Preferably, the n-type GaAs substrate 3 has a thickness of at least 100 µm but not more than 200 µm, or 100 µm or less. For example, the n-type GaAs substrate 3 has a thickness of 100 µm. The n-type GaAs substrate 3 has a bandgap higher than that of the active layer 7.

The n-type lower cladding layer 5 is the first cladding layer in this embodiment. The n-type lower cladding layer 5 is provided on the n-type DBR layer 4, which will be explained later, on the n-type GaAs substrate 3. The p-type upper cladding layer 10 is the second cladding layer in this embodiment and provided on the active layer 7, which will be explained later. The n-type lower cladding layer 5 and p-type upper cladding layer 10 are transparent to light having an emission wavelength. Because the n-type lower cladding layer 5 and p-type upper cladding layer 10 are not allowed to absorb oscillation light, a material having a bandgap higher than that of the active layer 7 is required for constructing these layers. For example, the n-type lower cladding layer 5 and p-type upper cladding layer 10 are constituted by GaInP, AlGaInP, AlGaAs, GaInAsP, or the like. Each of these semiconductor materials is lattice-matched to GaAs and therefore they can be grown on the GaAs substrate with good crystalline quality. Each of these semiconductor materials is a material having a higher bandgap energy than that of GaAs. For example, a band gap energy of GaAs is 1.42 eV. AlGaInP, which is lattice-matched to GaAs, has a bandgap energy within the range of at least 1.9 eV but not more than 2.3 eV according to its composition. AlGaAs, which is lattice-matched to GaAs, has a bandgap energy within the range of at least 1.42 eV but not more than 2.16 eV according to its composition. GaInAsP, which is lattice-matched to GaAs, has a bandgap energy within the range of at least 1.42 eV but not more than 1.9 eV according to its composition. GaInP, which is lattice-matched to GaAs, has a high bandgap energy of about 1.9 eV. Using these semiconductor materials for the n-type lower cladding layer 5 and p-type upper cladding layer 10 can increase the band gap differences between the active layer 7 and the cladding layers 5, 10, and therefore the carrier confinement into the active layer 7 can be enhanced. Therefore, oscillation and temperature characteristics of lasers can be improved.

For making it possible to fully confine light in the n-type lower cladding layer 5, it is desirable for the n-type lower cladding layer 5 to have a thickness of at least 1.5 µm but not more than 2 µm. For example, GaInP having a thickness of 1.5 µm is chosen as the n-type lower cladding layer 5.

The p-type upper cladding layer 10 is constituted by three regions, i.e., a flat first upper cladding part 11 provided in the lowest part, a second upper cladding part 12 having both side faces processed into a ridge, and a third upper cladding part 13 which is a flat part provided on the second upper cladding part 12, while a p-type etching stop layer 9 is provided between the first upper cladding part 11 and second upper cladding part 12. The second upper cladding part 12 has a so-called buried-ridge structure in which both ridge-like side faces of the second upper cladding part 12 are buried by an n-type current blocking layer 14, whereby currents are confined into the second upper cladding part 12.

An optimal value is selected for the thickness of the first upper cladding part 11 from within the range of at least 0.1 µm but not more than 0.6 µm in order to suppress high-order modes in the horizontal transverse mode and attain stable oscillations in the fundamental mode alone. For example, GaInP having a thickness of 0.4 µm is chosen as the first upper cladding part 11.

In order for the upper face of the second upper cladding part 12 (ridge part) and the upper face of the n-type current blocking layer 14 to have the same height so as to flatten the device surface, it is desirable for the second upper cladding part 12 to have a thickness on a par with that of the n-type current blocking layer 14. When the n-type current blocking layer 14 has a thickness of 0.4 µm, for example, the second upper cladding part 12 also has a thickness of 0.4 µm.

For making it possible to fully confine light in the p-type upper cladding layer 10, it is desirable for the third upper cladding part 13 to have a thickness of at least 0.7 µm but not more than 1.2 µm. For example, GaInP having a thickness of 0.7 µm is chosen as the third upper cladding part 13.

The n-type current blocking layer 14 is doped with an n-type dopant, whereby a pn junction is formed between the n-type current blocking layer 14 and the first upper cladding part 11. As a consequence, when the semiconductor optical device 1 is operated in a forward bias (by which the p-type electrode 17 side attains a higher potential), a reverse bias is automatically applied to the pn junction part, whereby the pn junction part exhibits a high resistivity. Therefore, currents are hard to flow into the n-type current blocking layer 14, so that the current supplied to the semiconductor optical device 1 is effectively confined into the second upper cladding part 12 (ridge part).

As a material constituting the n-type current blocking layer 14, the same semiconductor materials as those for the n-type lower cladding layer 5 and p-type upper cladding layer 10 mentioned above are preferred. That is, a high-bandgap material such as GaInP, AlGaInP, AlGaAs, GaInAsP, or GaAs lattice-matched to GaAs is chosen as the n-type current blocking layer 14. Preferably, the n-type current blocking layer 14 has a bandgap higher than that of the p-type upper cladding layer 10. As a consequence, the bandgap difference between the n-type current blocking layer 14 and p-type upper cladding layer 10 generates a heterobarrier at the interface between these layers. This further restrains currents from leaking to the n-type current blocking layer 14, whereby the current confinement into the second upper cladding part 12 can be enhanced. When the bandgap of the n-type current blocking layer 14 is higher than that of the p-type upper cladding layer 10, the refractive index of the second upper cladding part 12 becomes higher than that of the n-type current blocking layer 14, thereby making it possible to enhance the optical confinement into the center part of the semiconductor optical device 1 where the second upper cladding part 12 exists. As a result, stimulated emission occurs efficiently, whereby oscillation characteristics can be improved. The bandgap of the n-type current blocking layer 14 may also be equal to or lower than that of the p-type upper cladding layer 10; laser oscillations are possible in such a case as well.

For example, AlGaInP is used as the n-type current blocking layer 14. Preferably, the n-type current blocking layer 14 has a thickness of 0.3 µm or more. This can effectively block currents and fully confine them into the ridge part (second upper cladding part 12). A preferred thickness of the n-type current blocking layer 14 in this case is 0.4 µm, for example.

The current-confining width (W shown in FIG. 2) by the n-type current blocking layer 14 is preferably at least 1 µm but not more than 5 µm. This can suppress high-order modes in the horizontal transverse mode, so as to attain stable oscillations in the fundamental mode alone. A preferred value of the current-confining width W is 3 µm, for example.

In a ridge structure such as that in this embodiment, the thickness of the first upper cladding part 11 is an important factor for determining characteristics of the semiconductor optical device 1. Therefore, for securing uniformity and reproducibility in laser characteristics, it will be preferred that the thickness of the first upper cladding part 11 is controlled with a high accuracy. Hence, the p-type etching stop layer 9 is provided between the second upper cladding part 12 and first upper cladding part 11 in this embodiment. The etching rate of the p-type etching stop layer 9 for an etchant (e.g., an etchant based on hydrochloric acid) of the p-type upper cladding layer 10 is sufficiently lower than that of the upper cladding layer 10. That is, a material having a high etching selectivity ratio to the p-type upper cladding layer 10 is chosen as a material constituting the p-type etching stop layer 9. When the p-type upper cladding layer 10 is made of AlGaInP or GaInP while an etchant based on hydrochloric acid is used as an etchant for the upper cladding layer 10, for example, GaAs, AlGaAs, or GaInAsP whose etching rate for the hydrochloric-acid-based etchant is sufficiently lower than that of AlGaInP or GaInP is chosen as a material constituting the p-type etching stop layer 9, for example. When the p-type upper cladding layer 10 is made of AlGaAs, GaAs, or GaInAsP while an etchant based on phosphoric acid is used as an etchant for the upper cladding layer 10, for example, GaInP or AlGaInP whose etching rate for the phosphoric-acid-based etchant is sufficiently lower than that of AlGaAs, GaAs, or GaInAsP is chosen as a material constituting the p-type etching stop layer 9, for example. In this embodiment, the p-type etching stop layer 9 is not an essential constituent but may be omitted when the p-type upper cladding layer 10 can be etched with a high accuracy without the p-type etching stop layer 9.

When the semiconductor optical device 1 is equipped with the p-type etching stop layer 9, for restraining device resistance and thermal resistance from increasing, it will be preferred that the p-type etching stop layer 9 is as thin as possible within a range where an etching stop function is preserved. The etching stop layer 9 may have a thickness of at least 5 nm but not more than 30 nm. In a preferred example, GaAs having a thickness of 15 nm is chosen as the etching stop layer 9.

The active layer 7 is provided on the n-type lower cladding layer 5. For example, the active layer 7 has a single quantum well layer or multiple quantum well layers, in which material compositions and quantum well layer thicknesses are adjusted so as to yield a bandgap corresponding to oscillation light in a wavelength band of at least 0.9 µm but not more than 1.25 µm. While GaInAs and GaInAsP are typical materials for the active layer 7, they are not limitative; group III-V semiconductor materials containing at least Ga, As, and N such as GaInNAs and GaNAs, for example, can also be used. When a group III-V compound semiconductor material containing at least Ga, As, and N is used, its lattice constant is set to a value identical or close to that of GaAs. Therefore, they can be grown on the GaAs substrate with a good crystalline quality.

For attaining an emission wavelength of at least 0.9 µm but not more than 1.25 µm, it is necessary for GaInAs and GaInAsP used for the active layer 7 to have such a composition as to exhibit a lattice constant greater than that of GaAs. Therefore, growing these semiconductor materials on the GaAs substrate imparts a compressive strain to the active layer 7. When GaNAs is grown as the active layer 7 on the GaAs substrate, the active layer 7 has such a composition that a tensile strain is imparted thereto, since GaNAs has a lattice constant smaller than that of GaAs. When these strained stresses imparted to the active layer 7 are in excess, defects such as misfit dislocation due to the strained stresses may occur in the active layer 7. Therefore, the thickness of the active layer 7 needs to be below a limit film thickness where no defects are generated by strained stresses, i.e., below a critical film thickness. Since the thickness of quantum well layers constituting the active layer 7 is sufficiently smaller than the critical film thickness in general, favorable crystalline quality can be kept even when strain-imparting semiconductor materials are used as mentioned above.

When the active layer 7 is constructed by GaInAs or GaNAs which is a ternary semiconductor, only one composition ratio corresponds to a given oscillation wavelength. Therefore, the amount of strain of the active layer 7 in this case is fixed to a specific magnitude. When the active layer 7 is constructed by GaInAsP which is a quaternary semiconductor, on the other hand, composition ratios for realizing a desirable emission wavelength can be selected from within a wide range, whereby the amount of strain of the active layer 7 can also be selected from within a wide range. Hence, in this case, an optimal amount of strain or the composition ratio of the active layer 7 therefor can be chosen according to an emission wavelength suitable for the purpose of the semiconductor optical device 1, whereby the degree of freedom in designing the active layer 7 increases.

When the active layer 7 is made of GaInNAs, the amount of strain of the active layer 7 can approach zero, since GaInNAs can be lattice-matched to GaAs. Therefore, the active layer 7 is not restricted in terms of thickness and can have any thickness. In this case, a thick bulk semiconductor layer can be chosen as the active layer 7, for example.

The active layer 7 containing GaNAs or GaInNAs may further contain one or both of Sb and P. In the case where the active layer 7 is doped with Sb, Sb functions as a so-called surfactant, so as to suppress the three-dimensional growth of GaNAs and GaInNAs, thereby becoming effective in improving the crystalline quality of these semiconductors. In the case where the active layer 7 is doped with P, P reduces local crystal strains of GaNAs and GaInNAs, so as to contribute to improving the crystalline quality and reliability. In addition, P contributes to increasing the amount of N taken into crystals when the semiconductors containing N are grown. Examples of specific compositions of the active layer 7 containing Sb and P include GaNAsP, GaInNAsP, GaNAsSb, GaInNAsSb, GaNAsSbP, and GaInNAsSbP. The lattice constant of the semiconductor materials such as GaNAsP can be set to a value identical or close to the lattice constant of GaAs. Therefore, these semiconductor materials used for the active layer 7 can be grown on the GaAs substrate with good crystalline quality.

An example of the active layer 7 is a single quantum well layer of GaInAs having a bandgap corresponding to the emission wavelength of 0.98 μm. In this case, because the active layer 7 incurs a compressive strain, the active layer 7 preferably has a thickness of at least several nm but not more than ten-odd nm, e.g., 8 nm, which is not greater than the critical film thickness.

The lower optical confinement layer 6 is provided between the n-type lower cladding layer 5 and active layer 7. The upper optical confinement layer 8 is provided between the p-type upper cladding layer 10 and active layer 7. Examples of materials constituting the lower optical confinement layer 6 and upper optical confinement layer 8 include GaInP, AlGaInP, AlGaAs, GaInAsP, and GaAs which are lattice-matched to GaAs and can be also used for the n-type type lower cladding layer 5 and p-type upper cladding layer 10 as mentioned above. Preferably, the lower optical confinement layer 6 is constituted by a material having a bandgap between the n-type lower cladding layer 5 and active layer 7. Preferably, the upper optical confinement layer 8 is constituted by a material having a bandgap between the p-type upper cladding layer 10 and active layer 7. As a consequence, carriers can efficiently be injected into the active layer 7 from the p-type upper cladding layer 10 and n-type lower cladding layer 5 without being inhibited by heterobarriers formed between the cladding layers 5, 10 and optical confinement layers 6, 8 or between the active layer 7 and optical confinement layers 6, 8.

When the lower optical confinement layer 6 and upper optical confinement layer 8 are constructed by materials satisfying the bandgap conditions mentioned above, the refractive index becomes the highest in the active layer 7 among the semiconductor layers 5 to 10 and successively decreases as distanced from the active layer 7 in order of the optical confinement layers 6, 8 and cladding layers 5, 10. Such a structure causes the n-type lower cladding layer 5 and p-type upper cladding layer 10 to act so as to confine light generated in the active layer 7 into the active layer 7, lower optical confinement layer 6, and upper optical confinement layer 8, thereby enhancing the optical confinement in the active layer 7.

When GaInAsP is used as a material constituting the lower optical confinement layer 6, the composition ratio of GaInAsP is adjusted such that its bandgap attains a value between the n-type lower cladding layer 5 and active layer 7. For fully confining light in the active layer 7, it will be desirable that the thickness of the lower optical confinement layer 6 is at least several ten nm but not more than several hundred nm. The lower optical confinement layer 6 has a thickness of 47 nm, for example.

The same holds when GaInAsP is used as a material constituting the upper optical confinement layer 8; the composition ratio of GaInAsP is adjusted such that its bandgap attains a value between the p-type upper cladding layer 10 and active layer 7. For fully confining light in the active layer 7, it will be desirable that the thickness of the upper optical confinement layer 8 is at least several ten nm but not more than several hundred nm. The upper optical confinement layer 8 has a thickness of 47 nm, for example.

Providing the above-mentioned lower optical confinement layer 6 or upper optical confinement layer 8 on the lower or upper sides of the active layer 7 enhances the confinement of light into the active layer 7 without inhibiting carriers from being injected into the active layer 7, whereby oscillation and temperature characteristics are improved. Such effects become remarkable in particular when the active layer 7 is constituted by a relatively thin quantum well structure. In the semiconductor optical device 1 in accordance with this embodiment, the lower optical confinement layer 6 and upper optical confinement layer 8 are not essential constituents, but can be omitted when the optical confinement necessary for oscillations can be obtained by the active layer 7 alone.

The p-type contact layer 15 is provided on the p-type upper cladding layer 10. The p-type contact layer 15 is provided for ohmic contact with the p-type electrode 17. As a material constituting the p-type contact layer 15, low-bandgap materials such as GaAs which easily form ohmic contact with the p-type electrode 17 are preferably used. The p-type contact layer 15 preferably has a thickness of at least 0.1 μm but not more than 0.5 μm. For example, the p-type contact layer 15 has a thickness of 0.2 μm. For further enhancing current confinement into the ridge part (second upper cladding part 12), the insulating film 16 is provided on the p-type contact layer 15 and has an opening at a portion above the ridge part. The insulating film 16 in this embodiment is not an essential constituent and can be omitted when unnecessary. Preferred examples of materials constituting the insulating film 16 include dielectric films such as SiN and $SiO_2$. The n-type electrode 2 and p-type electrode 17, which are electrodes for feeding power, are formed on the back face of the n-type GaAs substrate 3 and on the p-type contact layer 15, respectively.

The n-type DBR layer 4 is the first DBR layer in this embodiment. The n-type DBR layer 4 is provided on the n-type GaAs substrate 3 so as to be held between the n-type GaAs substrate 3 and n-type lower cladding layer 5. The n-type DBR layer 4 is constructed by a multilayer film in which first and second semiconductor layers S1, S2 having respective refractive indices different from each other are periodically stacked in an alternating manner. For keeping absorption loss from increasing, the n-type DBR layer 4 is made of a semiconductor material transparent to light having an emission wavelength of at least 0.9 μm but not more than 1.25 μm. Compositions and thicknesses of the first and second semiconductor layers S1, S2 constituting the n-type DBR layer 4 are optimized so as to exhibit a high reflectivity with respect to light having the emission wavelength. In the case where each of the first and second semiconductor layers S1, S2 has a thickness of $\lambda/(4n)$ (i.e., is a $\lambda/4$ film), where $\lambda$ is the emission wavelength, and n is the effective refractive index of each semiconductor layer, for example, the reflectivity can be enhanced most effectively by stacking the first and second semiconductor layers S1, S2 alternately.

The n-type DBR layer 4 includes a plurality of first semiconductor layers S1 and a plurality of second semiconductor layers S2 alternately stacked to each other. The refractive index of the first semiconductor layers S1 is different from that of the second layers S2. For example, n-type AlAs layer or n-type AlGaAs layer are used for the first semiconductor layers S1, and n-type GaAs layer is used for the second semiconductor layers S2. Appropriately adjusting the compositions and thicknesses of these semiconductor layers can realize a high reflectivity of 99% or more, for example, with respect to light having a wavelength of at least 0.9 μm but not more than 1.25 μm. The n-type DBR layer 4 preferably has a high reflectivity which is greater than or equal to 50%. For example, a reflectivity of more than 57% is obtained when 6 pairs of $Al_{0.9}Ga_{0.1}As$ and GaAs layers, each of which is a λ/4 film, are stacked. And a reflectivity of 99% or higher is obtained when 30 pairs of $Al_{0.9}Ga_{0.1}As$ and GaAs layers, each of which is a λ/4 film, are stacked. These semiconductor layers are lattice-matched to GaAs and thus can be grown with good crystalline quality even when stacked by a large number. Since these semiconductor materials are transparent to light having a wavelength of at least 0.9 μm but not more than 1.25 μm, absorption loss hardly increases in the semiconductor optical device 1 even when the semiconductor optical device 1 has the n-type DBR layer 4 constituted by the semiconductor materials.

When a current is injected into the semiconductor optical device 1 as indicated by arrow C in FIG. 1, the active layer 7 emits light, thereby generating light guided through the active layer 7. However, the guided light is not confined in the active layer 7 alone, but guided with extending from the n-type lower cladding layer 5 to the p-type upper cladding layer 10. Arrow F in FIG. 1 indicates a front facet of the semiconductor optical device 1. A laser light is emitted from the front facet F. If no n-type DBR layer 4 is provided as in the conventional semiconductor optical device, the guided light extended into the n-type lower cladding layer 5 will be distributed such as to penetrate into the n-type GaAs substrate 3 as illustrated by area D in FIG. 2. As a result, a substrate mode such as the one mentioned above is excited, whereby this substrate mode and the original waveguide mode may be resonantly-coupled, so as to cause deteriorations in characteristics such as fluctuations in oscillation wavelengths (mode hops).

In the semiconductor optical device 1 in accordance with this embodiment, by contrast, the n-type DBR layer 4 is provided on the n-type GaAs substrate 3. Therefore, even the guided light reaching the lowest end of the n-type lower cladding layer 5, if any, is completely reflected by the n-type DBR layer 4 and thus does not leak to the n-type GaAs substrate 3 as illustrated by area E in FIG. 2. This can totally avoid excitation in the substrate mode, thereby suppressing its resulting laser characteristic deteriorations such as destabilization of oscillation wavelengths. Thus, in the semiconductor optical device 1 in accordance with this embodiment, the n-type DBR layer 4 provided on the n-type GaAs substrate 3 can eliminate the influence of the substrate mode more completely than the structure of Patent Document 2, thereby improving laser characteristics.

In the semiconductor optical device 1 in accordance with this embodiment, the n-type DBR layer 4 is provided between the n-type GaAs substrate 3 and n-type lower cladding layer 5 and thus can be epitaxially grown together with other semiconductor layers (the n-type lower cladding layer 5, active layer 7, p-type upper cladding layer 10, etc.), whereby the number of manufacturing steps can be reduced.

In the conventional semiconductor optical device, only a very small amount of guided light leaks from the lower cladding layer to the GaAs substrate; this very little leakage of light excites the substrate mode. Therefore, the guided light reflected by the n-type DBR layer 4 is very weak, so that the influence of reflection upon laser oscillation actions is negligible, whereby laser characteristics are not deteriorated by the reflection of guided light.

With reference to FIGS. 3 to 5, a manufacturing process of the semiconductor optical device 1 in accordance with this embodiment will now be explained. First, as shown in FIG. 3A, the n-type DBR layer 4, n-type lower cladding layer 5, lower optical confinement layer 6, active layer 7, upper optical confinement layer 8, p-type first upper cladding part 11, p-type intermediate layer (etching stop layer) 9, and p-type second upper cladding part 12 are epitaxially grown in this order on the n-type GaAs substrate 3. For growing these semiconductor layers, typical semiconductor crystal growing apparatus such as molecular beam epitaxy (MBE) apparatus and organometallic vapor phase epitaxy (OMVPE) apparatus can be used. Subsequently, a mask 20 for forming the ridge part is patterned on a predetermined area of the surface of the p-type second upper cladding part 12, and the p-type second upper cladding part 12 is etched through the mask 20.

A dielectric film made of SiN, $SiO_2$, or the like is used for the mask 20. Preferred as the method of etching the p-type second upper cladding part 12 is wet etching with an etchant which causes less processing damage. As a result of the etching, the p-type second upper cladding part 12 is etched into a ridge.

In the case where the p-type second upper cladding part 12 is constituted by GaInP or AlGaInP here, constructing the p-type intermediate layer 9 by GaAs, AlGaAs, or GaInAsP and using an etchant based on hydrochloric acid can make the etching rate for the p-type intermediate layer 9 sufficiently lower than that for the p-type second cladding part 12, whereby the p-type intermediate layer 9 can be used as the etching stop layer. Therefore, even when the etching rate for the p-type second upper cladding part 12 varies among manufacturing processes or within the wafer surface, the etching substantially stops when reaching the p-type etching stop layer 9, whereby a structure such as the one shown in FIG. 3B is formed. Consequently, favorable reproducibility and in-plane uniformity are achieved in terms of the thickness of the p-type first upper cladding part 11, whereby reproducibility and uniformity are secured in laser characteristics. When the p-type second upper cladding part 12 is made of GaAs, AlGaAs, or GaInAsP, the p-type intermediate layer 9 is constituted by GaInP or AlGaInP, while an etchant based on phosphoric acid is used. This can make the etching rate for the p-type intermediate layer 9 sufficiently smaller than that for the p-type second upper cladding part 12, whereby the p-type intermediate layer 9 can be used as the etching stop layer. Though FIG. 3B illustrates an reverse-mesa ridge, it is not limitative. Mesas in other shapes can also be formed by changing surface orientations for forming the mask or etchants.

The p-type etching stop layer 9 may remain in the whole device area, or the region of the p-type etching stop layer 9 outside the ridge part may be etched away when unnecessary. This embodiment illustrates a case where the part of the p-type etching stop layer 9 formed on the outside of ridge part is removed as shown in FIG. 4A. When thus partly etching the p-type etching stop layer 9 away, an etchant is appropriately selected such that the etching stops at the p-type first upper cladding part 11 thereunder contrary to the etching of the p-type second upper cladding part 12. In this case, the p-type first upper cladding part 11 is hardly etched, whereby favorable reproducibility and in-plane uniformity are secured in terms of the thickness of the p-type first upper cladding part 11. In a specific example where the p-type first upper cladding part 11 is constituted by AlGaInP or GaInP while the p-type etching stop layer 9 is constituted by GaAs, AlGaAs, or GaInAsP, using an etchant based on phosphoric acid can stop etching at the surface of the p-type first upper cladding part 11. In the case where the p-type first upper cladding part 11 is constituted by GaAs, AlGaAs, or GaInAsP while the p-type intermediate layer 9 is constituted by AlGaInP or GaInP, using an etchant based on hydrochloric acid can stop etching at the surface of the p-type first upper cladding part 11.

In the case where the p-type intermediate layer (etching stop layer) 9 exists only in the ridge part, adjusting material characteristics of the p-type etching stop layer 9 can improve laser characteristics. When a material having a refractive index higher than that of the n-type current block layer 14 is used as a material constituting the p-type etching stop layer 9, for example, the effective refractive index of the center portion formed with the ridge part can be made higher than that of the n-type current blocking layer 14 on both sides thereof. This can confine the oscillation light more effectively in the center part of the semiconductor optical device 1, thereby further improving oscillation characteristics. In a specific example where both of the p-type upper cladding layer 10 and n-type current blocking layer 14 are constituted by GaInP, GaAs, which has a refractive index higher than that of GaInP, is preferred as a material constituting the p-type etching stop layer 9.

Thereafter, while the mask 20 remains, the n-type current blocking layer 14 is grown. In this step, as shown in FIG. 4B, no crystal grows on the mask 20, whereby a buried-ridge structure in which both sides of the ridge part (p-type second upper cladding part 12) are buried by the n-type current blocking layer 14 is obtained.

Figure 5A:
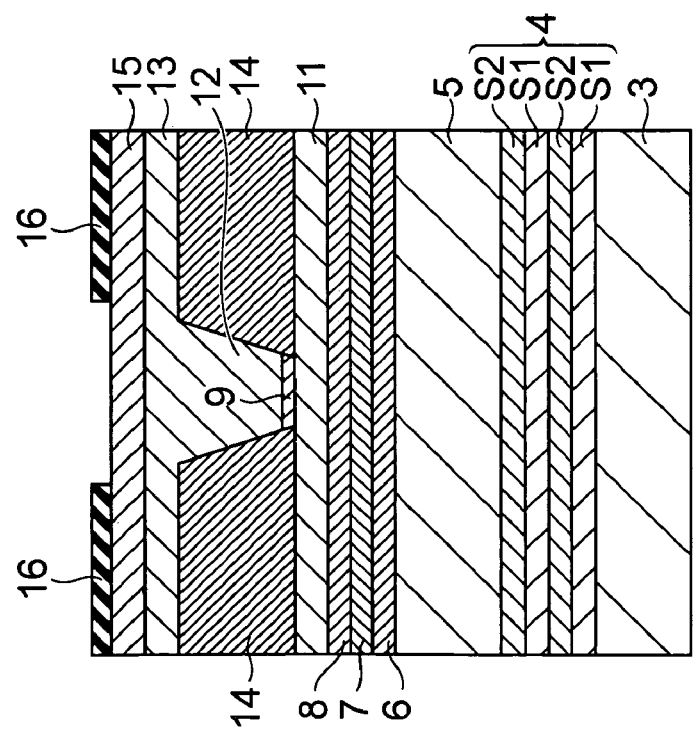
FIGS. 5A and 5A are process diagrams showing the method of manufacturing the semiconductor optical device in accordance with the first embodiment.

Subsequently, the mask 20 is removed. Further, as shown in FIG. 5A, the p-type third upper cladding part 13 and p-type contact layer 15 are grown, and the insulating film 16 is formed.

Figure 5B:
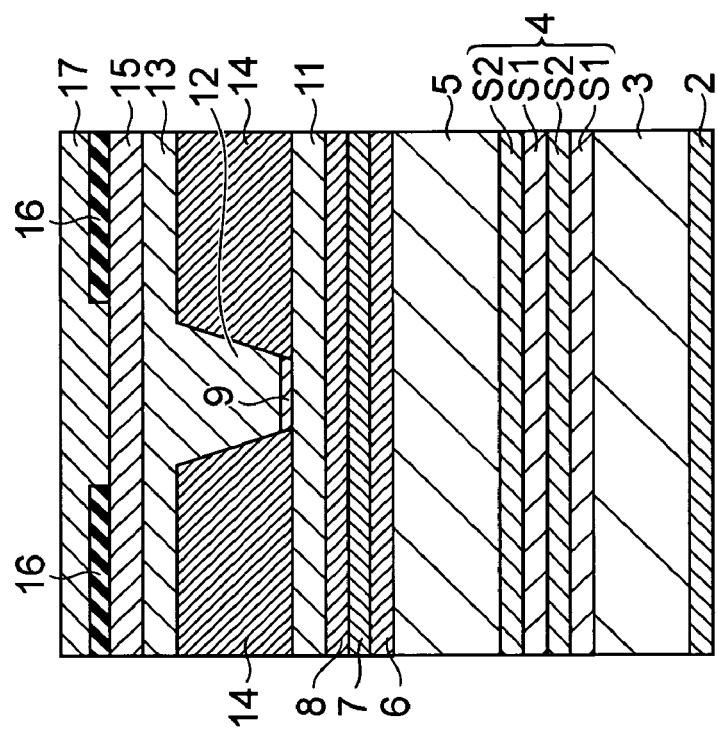

Finally, the n-type GaAs substrate 3 is thinned by polishing or the like to a cleavable thickness (at least 100 μm but not more than 200 μm, or 100 μm or less), and then the n-type electrode 2 and p-type electrode 17 are formed by a method such as vacuum evaporation or sputtering as shown in FIG. 5B, whereby the semiconductor optical device 1 that is a buried-ridge type laser shown in FIGS. 1 and 2 is completed. Thus, in the semiconductor optical device 1 in accordance with this embodiment, the n-type DBR layer 4 can be epitaxially grown together with other semiconductor layers (the n-type lower cladding layer 5, active layer 7, p-type upper cladding layer 10, etc.), whereby the number of manufacturing steps can be reduced.

Figure 6:
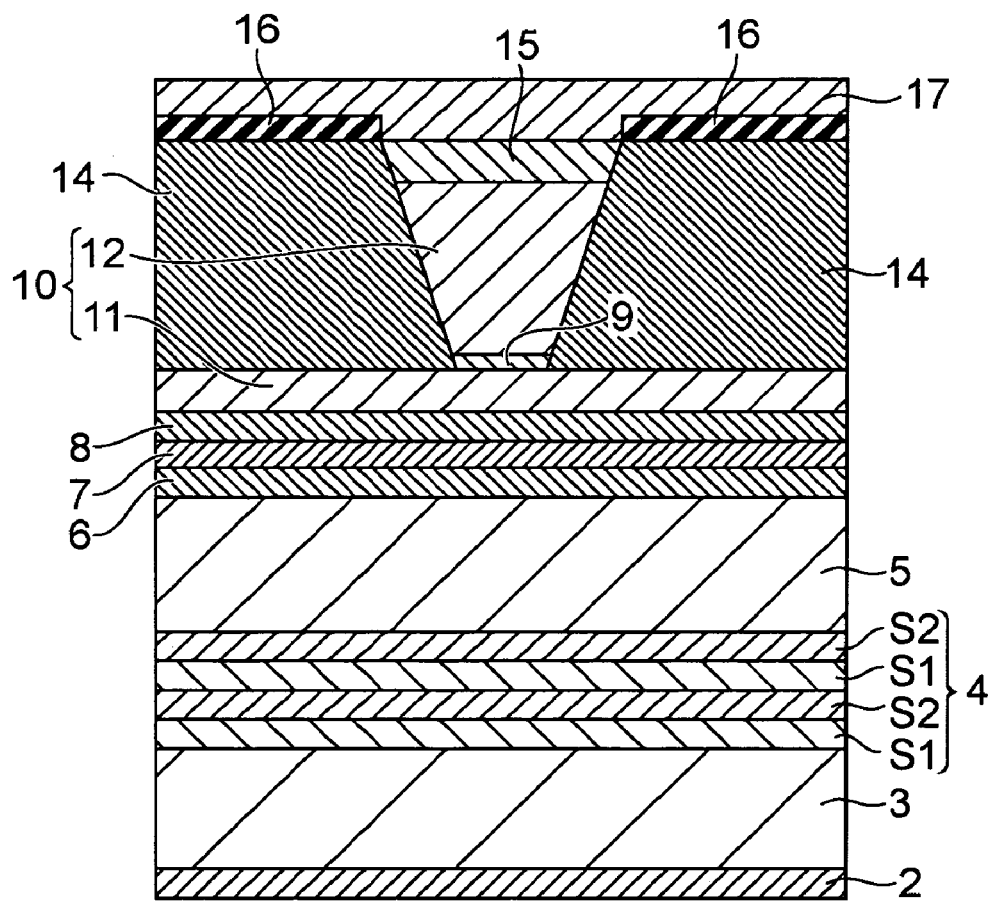
FIG. 6 is a sectional view showing a modified example of the semiconductor optical device in accordance with the first embodiment.

The ridge-structure in the semiconductor optical device 1 is not limited to that mentioned above, but any structure which can confine current is selectable. An example of the structure shown in FIG. 6 is constructed such that, on the ridge-shaped p-type second upper cladding part 12, the p-type contact layer 15 etched into a similar ridge form is provided, and both side faces of the p-type second upper cladding part 12 and p-type contact layer 15 are buried in the n-type current blocking layer 14. Preferably, when making thus constructed semiconductor optical device, the semiconductor layers from the n-type DBR layer 4 to the p-type contact layer 15 are epitaxially grown together, then the p-type second upper cladding part 12 and p-type contact layer 15 are etched into a ridge form, and thereafter the n-type current blocking layer 14 is formed. Therefore, this structure necessitates only two crystal growing steps, whereas the device structure of FIG. 1 needs three, whereby the manufacturing process can be simplified.

Second Embodiment

Figure 7:
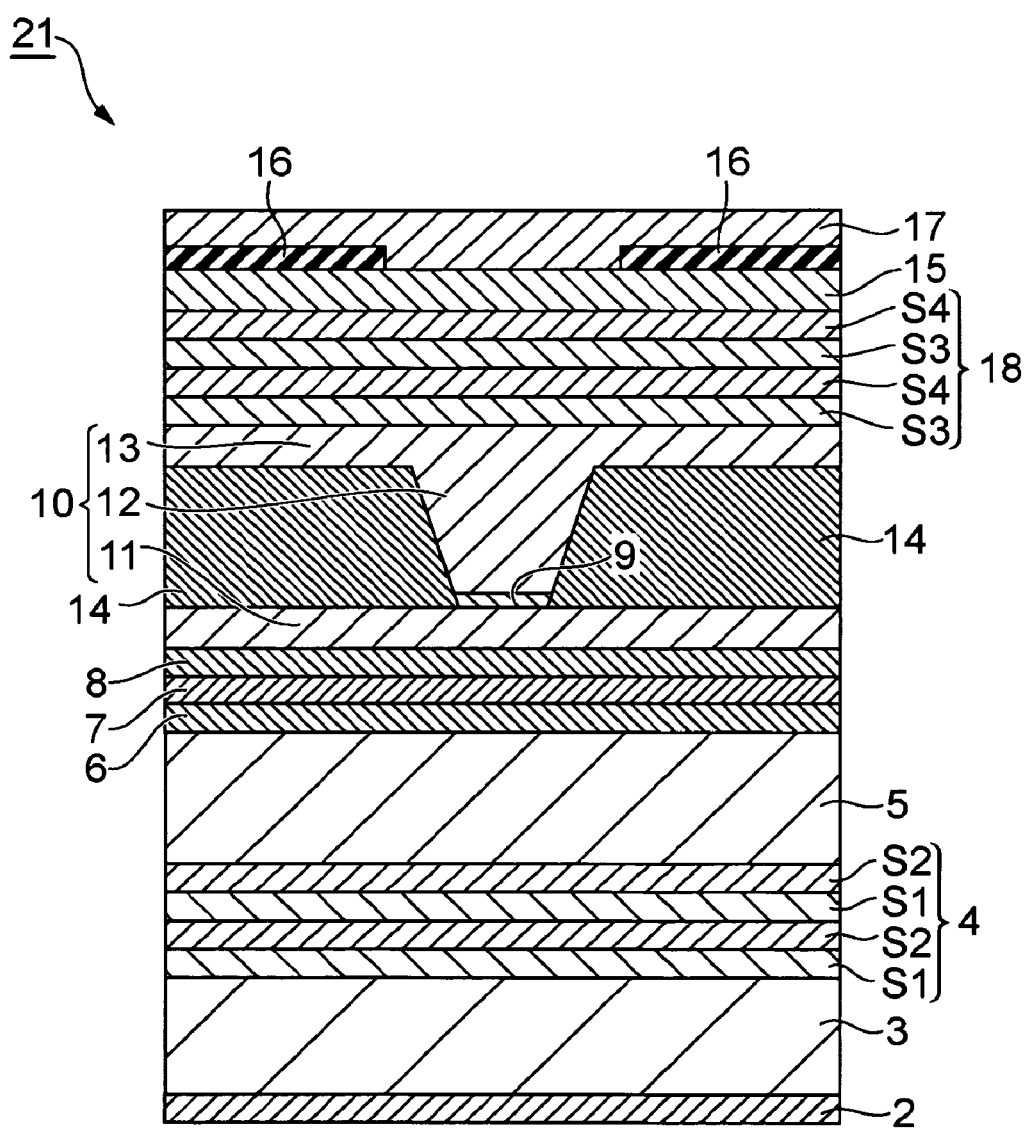
FIG. 7 is a sectional view showing the semiconductor optical device in accordance with the second embodiment.
Figure 8:
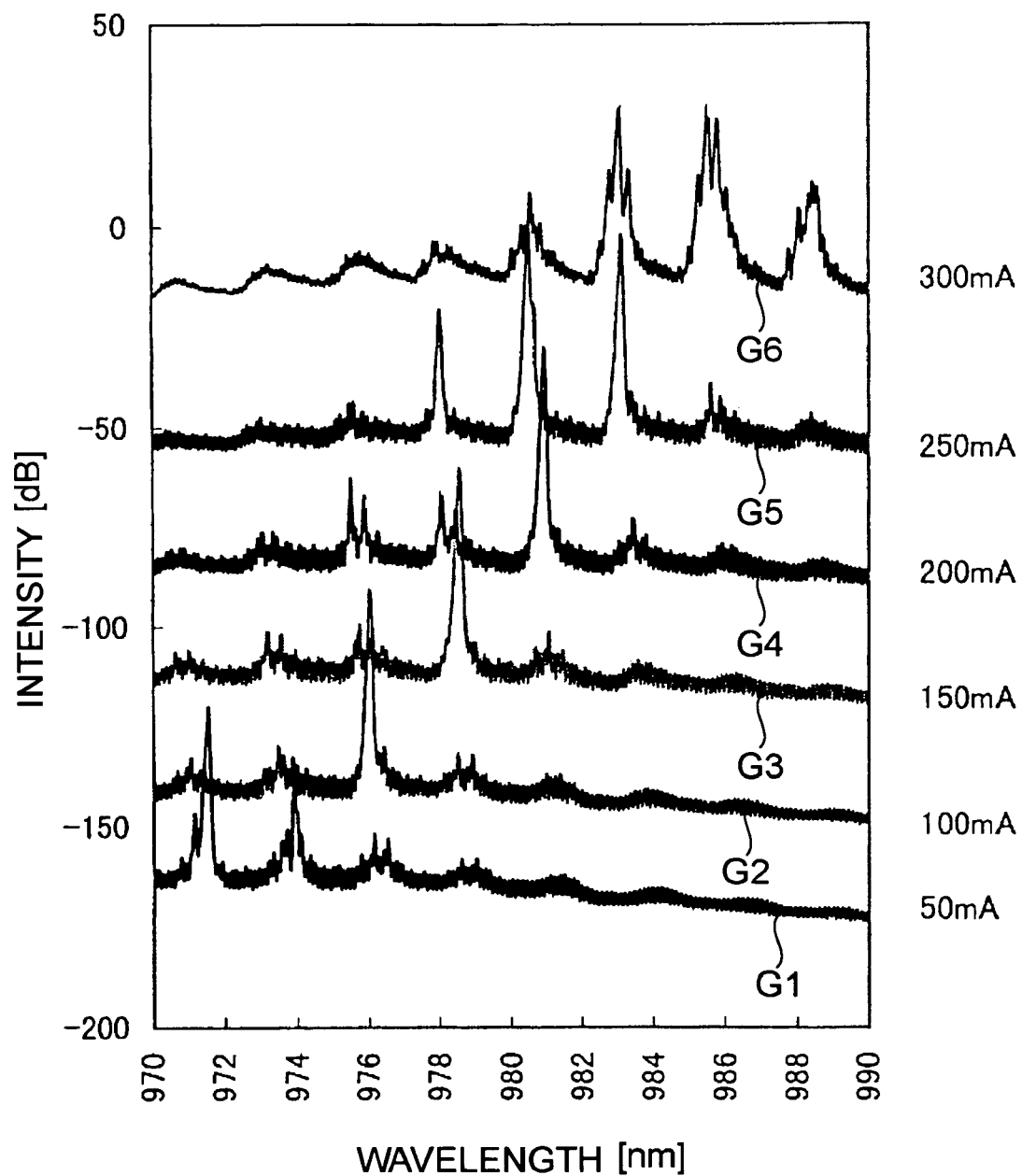
FIG. 8 is a graph showing typical examples of oscillation spectra of a semiconductor laser.

FIG. 7 is a sectional view showing a semiconductor optical device 21 in accordance with the second embodiment. The first embodiment relates to the semiconductor optical device 1 including the n-type DBR layer 4 between the n-type GaAs substrate 3 and n-type lower cladding layer 5. As shown in FIG. 7, the semiconductor optical device 21 in accordance with the second embodiment further comprises a p-type DBR layer 18 between the p-type contact layer 15 and p-type upper cladding layer 10 in addition to the n-type DBR layer 4. Except for the p-type DBR layer 18, the structure of the semiconductor optical device 21 is the same as that explained in the first embodiment.

In terms of structure and material, the p-type DBR layer 18 can be made as with the n-type DBR layer 4 explained in the first embodiment. That is, the p-type DBR layer 18 is formed by periodically stacking third and fourth semiconductor layers S3, S4 having respective refractive indices different from each other in an alternating manner. For example, p-type GaAs layer is used for the third semiconductor layers S3, and p-type AlAs layer or AlGaAs layer are used for the fourth semiconductor layers S4. These semiconductors are constructed by transparent semiconductor materials which are transparent to light within the wavelength band of at least 0.9 μm but not more than 1.25 μm in order to keep absorption loss from increasing. Compositions and thicknesses of the semiconductor layers constituting the p-type DBR layer 18 are optimized so as to exhibit a high reflectivity with respect to light having the emission wavelength of the semiconductor optical device.

In the case where each of the third and fourth semiconductor layers S3, S4 has a thickness of $\lambda/(4n)$ (i.e., is a $\lambda/4$ film), where $\lambda$ is the emission wavelength of the semiconductor optical device 21, and n is the effective refractive index of the third and fourth semiconductor layers, in particular, the p-type DBR layer 18 in which these thin semiconductor layers are alternately stacked is desirable in that it can enhance the reflectivity most effectively.

Effects of the semiconductor optical device 21 in accordance with this embodiment will now be explained. GaAs is often used as a semiconductor material for the p-type contact layer 15. In this case, the p-type contact layer 15 exhibits a refractive index higher than that of the p-type upper cladding layer 10. Therefore, the p-type contact layer 15 made of GaAs can become a waveguide for light having a wavelength of at least 0.9 μm but not more than 1.25 μm as with the n-type GaAs substrate 3, so that, when light from the active layer 7 leaks to the p-type contact layer 15, an intrinsic mode guided through the p-type contact layer 15 is formed. When this mode couples with the original waveguide mode of the active layer 7, laser characteristics may deteriorate as in the case of the substrate mode.

Since the p-type DBR layer 18 is provided between the p-type contact layer 15 and p-type upper cladding layer 10 in the semiconductor optical device 21 in accordance with this embodiment, the guided light generated in the active layer 7 and extended to the p-type upper cladding layer 10 is completely reflected by the p-type DBR layer 18 even when reaching the uppermost end of the p-type upper cladding layer 10. Therefore, the semiconductor optical device 21 in accordance with this embodiment can effectively restrain the guided light from leaking to the p-type contact layer 15, so that the waveguide-mode excitation due to the p-type contact layer 15 is avoided, whereby its resulting deteriorations in laser characteristics can be suppressed.

Only a very small amount of guided light leaks from the p-type upper cladding layer 10 to the p-type contact layer 15. Therefore, the guided light reflected by the p-type DBR layer 18 is very weak, so that the influence of reflection upon laser actions is negligible and thus does not deteriorate laser characteristics.

Since the p-type DBR layer 18 can be epitaxially grown together with the p-type third upper cladding part 13 and p-type contact layer 15, the number of manufacturing steps can be kept from increasing.

As explained in the foregoing, further providing the p-type DBR layer 18 between the p-type contact layer 15 and p-type upper cladding layer 10 can eliminate the occurrence of waveguide mode due to the p-type contact layer 15 in addition to the substrate mode. This can effectively suppress disturbance factors for laser oscillations, thereby further stabilizing wavelength characteristics of the laser device.

The DBR layer 4 in the first embodiment or the DBR layer 18 in the second embodiment is constructed by alternately stacking first and second semiconductor layers S1 and S2, or third and fourth semiconductor layers S3 and S4 having different refractive indices (i.e., different bandgaps). As a result, a number of heterojunction interfaces are formed within the DBR layers 4, 18. Such heterojunction interfaces are effective in blocking intrusions of crystal defects from the outside. Therefore, providing the n-type DBR layer 4 and p-type DBR layer 18 can effectively inhibit crystal defects from intruding from the GaAs substrate 3 and p-type contact layer 15 into the active layer 7, whereby the reliability of the semiconductor optical device can be improved.

The semiconductor optical device in accordance with the present invention can be modified in various ways without being restricted to the above-mentioned embodiments. For example, though the first and second embodiments illustrate the semiconductor optical devices 1 and 21 including the n-type GaAs substrate 3 and having an emission wavelength of at least 0.9 µm but not more than 1.25 µm, the semiconductor optical device in accordance with the present invention may comprise a p-type GaAs substrate in place of the n-type GaAs substrate 3. Preferably, in this case, the semiconductor layers have conduction types opposite from those in the above-mentioned embodiments, i.e., p- and n-type semiconductors are arranged in the areas of n- and p-type semiconductors in the above-mentioned embodiments, respectively. Compositions of the active layer and other semiconductor layers are not limited to those exemplified in the above-mentioned embodiments.

The present invention is not limited to semiconductor lasers such as those of the above-mentioned embodiments, but is applicable to other semiconductor optical devices of the edge-emitting type such as LED, electroabsorption optical modulators, Mach-Zehnder optical modulators, and SOA, for example. When the present invention is employed in these device configurations, removing the substrate mode improves characteristics of guided light effectively. As compared with the conventional semiconductor optical devices, the present invention can simplify the manufacturing process and shorten the time thereof, thereby improving the yield and lowering the cost.

What is claimed is:

1. A semiconductor optical device of an edge-emitting type having a predetermined emission wavelength, the semiconductor optical device consisting essentially of:
   a semiconductor substrate;
   a single DBR layer having first and second semiconductor layers stacked alternately and provided on the semiconductor substrate;
   a first cladding layer having a thickness of at least 1.5 µm but not more than 2 µm provided on the first semiconductor DBR layer;
   an active layer, with upper and lower optical confinement layers, provided on the first cladding layer;
   a second cladding layer provided on the active layer;
   a ridge structure extending in a light propagation direction;
   a front facet and a back facet;
   a laser cavity defined only by the front facet and the back facet in the light propagation direction; and
   wherein the semiconductor substrate has a bandgap higher than that of the active layer; and
   wherein the first semiconductor DBR layer is transparent to the emission wavelength, and the first and second semiconductor layers have respective refractive indices different from each other, thereby avoiding substrate-mode excitation.

2. A semiconductor optical device according to claim 1, wherein the semiconductor substrate is a GaAs substrate, and wherein the active layer has a bandgap corresponding to an emission wavelength of at least 0.9 µm but not more than 1.25 µm.

3. A semiconductor optical device according to claim 1, wherein the first semiconductor layer is constituted by AlAs or AlGaAs, and wherein the second semiconductor layer is constituted by GaAs.

4. A semiconductor optical device according to claim 1, wherein the active layer is constituted by a semiconductor material selected from GaInAs, GaInAsP, and III-V compound semiconductor containing Ga, As, and N.

5. A semiconductor optical device according to claim 1, wherein the first cladding layer is constituted by a semiconductor material having a bandgap energy higher than that of the semiconductor substrate.

6. A semiconductor optical device according to claim 1, wherein the first cladding layer is constituted by GaInP, AlGaInP, AlGaAs, or GaInAsP.

7. A semiconductor optical device according to claim 1, wherein the second cladding layer includes a first upper cladding part and a second upper cladding part provided on the active layer in this order, and
   the second upper cladding part has the ridge structure.

8. A semiconductor optical device according to claim 7, wherein the first upper part has a thickness of at least 0.1 µm but no more than 0.6 µm.

9. A semiconductor optical device according to claim 1, further comprising,
   an electrode provided over the second cladding layer.

* * * * *